United States Patent [19]
West

[11] 3,717,822
[45] Feb. 20, 1973

[54] PHASE SHIFT OSCILLATOR

[75] Inventor: James L. West, Concord, Mass.
[73] Assignee: Rotek Instrument Corp., Waltham, Mass.

[22] Filed: Feb. 25, 1972
[21] Appl. No.: 229,336

[52] U.S. Cl. ....................331/11, 331/135, 331/136
[51] Int. Cl. ..............................................H03b 3/04
[58] Field of Search........................331/11, 135, 136

[56] References Cited

UNITED STATES PATENTS 3,396,347 8/1968 Richman et al. ....................331/136

*Primary Examiner*—John Kominski
*Attorney*—Robert J. Schiller et al.

[57] ABSTRACT

This invention provides a sinusoidal phaseshift type of oscillator having two phase related outputs and having improved means for controlling the value of the amplitude of one of the output signals at a specific phase or reference time determined by the second signal.

9 Claims, 4 Drawing Figures

PHASE SHIFT OSCILLATOR

This invention relates to precision frequency generators, and more particularly to sources of amplitude-controlled, variable frequency sinusoidal signals.

It is known that one may connect a pair of integrating amplifiers sandwiching an inverting operational amplifier in a series connected closed-loop arrangement to obtain a dual-integrator phase-shift oscillator. The first integrator amplifier provides a 90° phase shift, the next amplifier or inverter, of course, introduces a 180° phase shift, and the last integrator adds a last phase shift of 90°. The total phase shift, fed back to the input of the first amplifier should sustain oscillation. However, the total phase shift may not be exactly 360° because the individual phase shifts provided by the integrators are usually not exactly 90° in practice. Thus, the system also includes a nonlinear element in the loop so that the oscillator output will be stable and neither increase nor decrease with time.

Oscillators of this type can be employed to provide variable frequency outputs by controlling the frequency determining elements, and the amplitude of the output signals can be controlled by carefully governing the phase-shift of the oscillation-sustaining feedback signal. Such an oscillator is described in U.S. Pat. No. 3,396,347 issued Aug. 6, 1968 to Peter L. Richman et al. In this latter device, the waveform is rectified and the rectified signal is compared with a DC standard or control voltage to provide an error signal. The error signal is filtered and applied to a non-linear element in the oscillator loop, thereby controlling the amplitude of oscillation. However, the control provided is slow to respond to control changes and tends to insert harmonic distortion noise because of the finite filtering action. A typical response time to recover from a control change is about 15 seconds at an oscillation frequency of 50 Hz.

The circuit disclosed in U.S. Pat. No. 3,382,461 issued May 7, 1968 to H. O. Wolcott, seeks to overcome the problem of slow response by using, instead of a rectifier-filter type control, a sample-and-hold system to measure the difference between the peak amplitude of oscillation and the DC control voltage. The Wolcott device incorporates an analog sampling device which must be opened and closed by a short pulse (constant duty factor) once each cycle. Such sampling devices tend to introduce amplitude errors and distortions at high frequencies because the pulse edges are capacitively coupled to the sampling point.

A principal object of the present invention is to provide a sinusoidal phase-shift type of oscillator having two phase related outputs and having improved means for controlling the value of the amplitude of one of the output signals at a specific phase or reference time determined by the second signal. Another object of the present invention is to provide such an oscillator which reduces the deficiencies noted above with respect to the prior art. Yet other objects of the present invention are to provide such an oscillator having control means operative at relatively high speed with minimization of distortion introduced into the output signal; and to provide such an oscillator wherein a control signal is developed by sampling the difference between a peak amplitude of the sinusoidal signal and a control DC level as a temporal value which is then caused to be nulled, so that at null no high frequencies are applied to the analog circuits to introduce distortion or error.

Generally, the foregoing and other objects of the present invention are realized with a system for controlling the amplitude of a sinusoid by transforming it into an axis-crossing time with respect to a reference axis-crossing time preferably of a quadrature reference sine wave. The transformation is accomplished by means for adding the sinusoid and reference wave of the same polarity to a substantially steady state control level of opposite polarity and applying the sum to a first threshold detector. The detector provides a rectangular wave output having its edges, axis-crossings, or zero values occurring only when the sum of the sinusoid and reference waves is equal to the steady state level. The reference wave is applied to a second threshold detector to establish an axis-crossing time for the quadrature signal. The time difference $\Delta T$ between the axis-crossing time of the quadrature signal and the time of one of the axis-crossings of the rectangular output wave of the first detector is then a function of the difference in amplitude between the main sinusoid and the steady-state control level. The value $\Delta T$ is assigned a sense and is used to control the amplitude of the basic sinusoid.

Other objects of the present invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims. For a fuller understanding of the nature and objects of the present invention, reference should be had to the following detailed description taken in connection with the accompanying drawings wherein:

Figure 1:
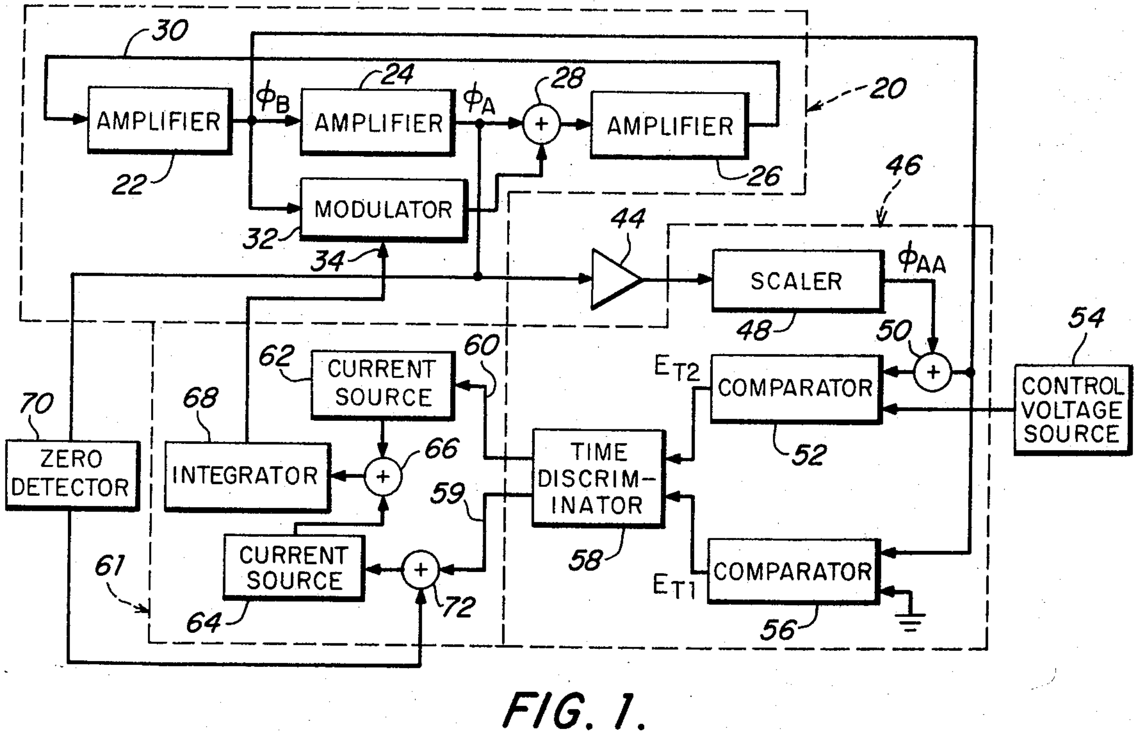
FIG. 1 is a block diagram of an exemplary device embodying the principles of the present invention.

Referring now to the drawings there is shown in FIG. 1 a variable-frequency, precision, sinusoidal voltage source comprising a phase shift oscillator 20 enclosed within a block delineated by dashed lines. Oscillator 20 includes a pair of amplifiers 22 and 24 exhibiting unity gains at some oscillation frequency $f_o$.

Each of amplifiers 22 and 24 provides a phase shift of $-\pi/2$. Oscillator 20 includes a third amplifier 26 exhibiting unity gain at $f_o$ and having a phase shift of $-\pi$. Amplifiers 22, 24 and 26 are connected in cascade so that the output of amplifier 22 feeds the input to amplifier 24, the output of the latter being coupled to the input of amplifier 26 through summing junction 28. The output of amplifier 26 is connected by feedback loop 30 to the input of amplifier 22, thereby creating an oscillator loop having an overall phase shift of 0 and unity gain at $f_o$. Typically, amplifiers 22 and 24 are operational amplifier integrators such as are described on p. 519, *Electronic Circuits Manual*, J. Markus, Mc- Graw-Hill Book Company, 1971. Such devices may be tuned to $f_o$ by adjustment of the values of their input and feedback impedances. In order to include summing point 28, amplifier 26 can be an operational summing amplifier such as the type shown on p. 512 of Electronics Circuits Manual, Supra.

Lastly, oscillator 20 includes modulator 32 having its input connected to the output of amplifier 22 and its output connected to summing point 28. Modulator 32 is preferably a simple amplitude modulator which changes the amplitude of an input ac signal in accordance with the amplitude of a DC control signal and provides an output AC, $\epsilon$, either of the same or inverted phase relative to the input AC according to the sense or polarity of the DC control signal. A typical device useful as modulator 32 is Model MC 1596 Modulator available from Motorola Semiconductor Devices and described in Motorola Data Sheet DS 9132 of August 1968. This latter device advantageously provides the desired modulation without any dc error signal, noise or harmonics associated with the error signal being introduced into the modulated ac output.

Oscillator 20, as thus described is quite similar to those known in the prior art in operation. The output signals of amplifiers 22 and 24 respectively can be characterized as AC signals $\phi_B$ and $\phi_A$ having peak voltages respectively of $V_B$ and $V_A$.

The output of modulator 32 can be identified as a voltage and is, of course, the same or opposite in phase to $\phi_B$.

Modulator 32 accepts $\phi_B$ as its input, and depending on some error control signal $E_s$ applied at control terminal 34 of modulator 32, causes $\epsilon$ to vary accordingly in sense and amplitude. The injection of $\epsilon$ as a quadrature signal with respect to the output of amplifier 24 at summing point 28 can cause the total phase shift around the oscillator loop to be greater than, less than or equal to zero. As signals $\phi_A$ and $\phi_B$ change depending upon the precision with which the oscillation criterion is met, and the nature of oscillation control signal $\epsilon$ there is, of course, one specific value and sense (i.e. phase with respect to $\phi_B$) of $\epsilon$ for which the amplitudes of $\phi_A$ and $\phi_B$ should remain constant and the net loop phase shift to become zero. If amplifiers 22, 24 and 26 and modulator 32 are linear over the complete excursion of their output signals, the oscillation in the oscillator loop is sinusoidal without harmonic distortion.

The embodiment of FIG. 1 further includes amplifier 44, preferably a power amplifier having negligible distortion and phase shift at $f_o$. The input of amplifier 44 is connected to the output of amplifier 24.

A phase measuring system 46 is provided, comprising a linear scaler 48 having its input connected to the output of amplifier 44. Scaler 48 typically is a simple scaling operational amplifier of known type. Both the output of scaler 48 and the output of amplifier 22 are connected to summing junction 50 at one of two inputs of comparator 52. A source 54 of controllable, substantially steady-state or DC input voltage Ec is provided and is connected to the other of the two inputs of comparator 52. A second like comparator 56 is also provided, having one of its inputs connected to the output of amplifier 22 and the other of its inputs connected to system ground. Both comparators typically are high-gain, floating input amplifiers which provide positive or negative gain according to the input connections, and can, for example be Type 311 Comparators commercially available from National Semiconductor Company and described in National Semiconductor Company Catalog, "Linear Integrated Circuits," 1971 at p. 146. The outputs of the comparators are connected to respective inputs of time discriminator 58, a gating circuit which will be described in detail hereinafter.

It will be seen that signal $\phi_A$ is amplified and scaled to provide signal $\phi_{AA}$, which is then added to signal $\phi_B$ at junction 50 to provide summation $(\phi_{AA} + \phi_B)$. The peak value of this latter sum is compared in comparator 52 with the DC output voltage of source 54, Ec, to generate a voltage $E_{T2}$. Similarly, the peak voltage of $\phi_B$ is compared to ground reference in comparator 56 to yield an output voltage $E_{T1}$.

Figure 2:
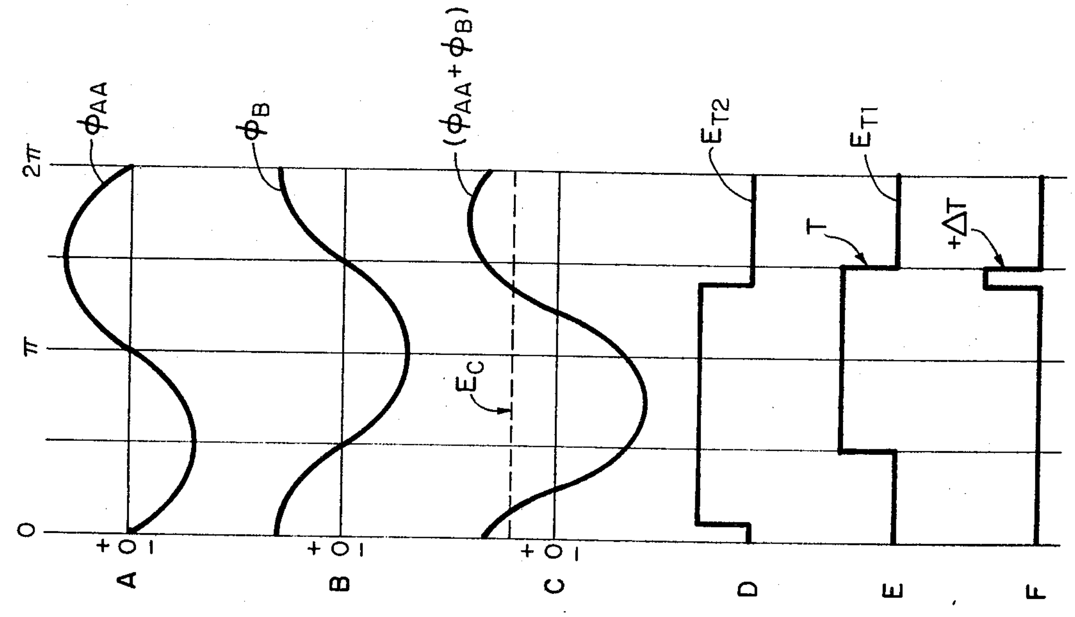
FIG. 2 is a plurality of idealized waveforms on a common time axis illustrating operation of the embodiment of FIG. 1 where the peak amplitude of the controlled sinusoid is greater than the level of a DC control voltage.

Referring now to FIG. 2, an idealized sinusoid identified as $\phi_{AA}$ is shown at A and another or quadrative reference $\phi_B$ is shown at B. Both sinusoids are shown to be substantially 90° out of phase with one another on their common time axis. FIG. 2C shows the summation of signals $\phi_A$ and $\phi_B$ and its comparison with the DC level of Ec when Ec is less than the peak value of the voltage of signal $\phi_{AA}$. Comparator 56 provides a signal $E_{T1}$ shown at FIG. 2E which exhibits transitions when $\phi_B$ is zero (i.e. its voltage is equal to ground reference). In FIG. 2E the positive-going transition or leading edge of the output signal from comparator 56 occurs as $\phi_B$ goes through an axis-crossing from positive to negative, and the negative-going transition or trailing edge of the signal occurs as $\phi_B$ goes through zero in a positive-going excursion.

Similarly, comparator 52 provides positive-going and negative-going transitions (or leading and trailing edges) of the signal shown in FIG. 2D as $E_{T2}$ according as the combined signal ($\phi_{AA}$ and $\phi_B$) makes its axis-crossing excursions through the reference level or axis provided by the DC voltage $E_C$.

It should be noted that the trailing edge of the signal at FIG. 2E can be considered to occur at reference time T when $\phi_B = 0$ and consequently when $(\phi_{AA} + \phi_B) = \phi_{AA}$ (since $\phi_{AA}$ and $\phi_B$ are about $\pi/2$ radians apart) $\phi_{AA}$ is at or very near its peak value at time T. If now at time T, $(\phi_{AA} + \phi_B)$ equals $E_c$, the trailing edges of both of the wave forms at FIGS. 2D and 2E will be coincident.

Figure 3:
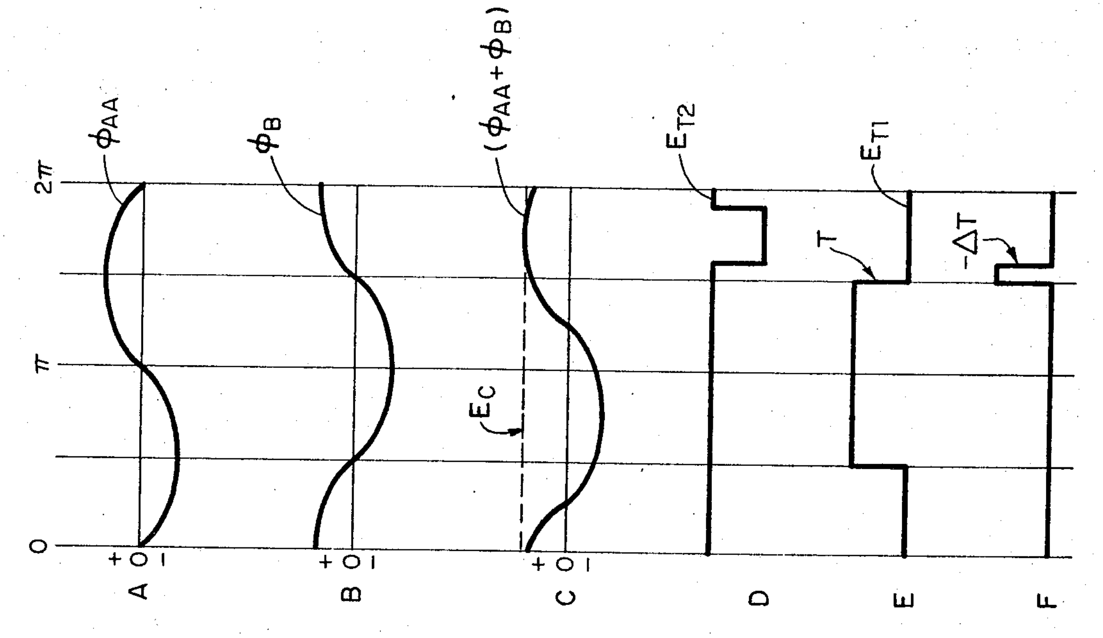
FIG. 3 is a plurality of idealized waveforms on a common time axis illustrating operation of the embodiment of FIG. 1, where the peak amplitude of the controlled sinusoid is less than the level of the DC control voltage.

Similar waveforms generally are shown in FIG. 3 except that the peak value of $\phi_{AA}$ is less than $E_c$. Hence, the trailing edge of FIG. 3D occurs after that shown in FIG. 3E.

It should also be noted that if the peak value of $(\phi_{AA} + \phi_B)$ is much greater or smaller than $E_c$, it is possible that no axiscrossings can be detected and the device cannot operate at these extremes. For proper operation $E_c$ must not be at ground value and must be less than the peak value of the summation $(\phi_{AA} + \phi_B)$.

Time discriminator 58 serves to compare the appropriate edges of the outputs $E_{T1}$ and $E_{T2}$ from comparators 56 and 52 and provides a pulse of duration $\Delta T$ on a positive output line 59 when $\Delta T$ is logically positive (e.g. the trailing edge of $E_{T2}$ occurs before the comparable trailing edge of $E_{T1}$ as shown in FIG. 2 or on negative line 60 when $\Delta T$ is logically negative (e.g. the appropriate transitions of $E_{T1}$ and $E_{T2}$ occur in reversed order as shown in FIG. 3). Of course if $\Delta T$ is zero within the resolution of the discriminator, the latter provides no output.

The device of FIG. 1 includes a modulator controller 61 comprising a pair of sources 62 and 64 of substantially steady-state currents, the latter of which is controlled by the positive line 59 from discriminator 58 to provide a steady-state current for a time equal to the duration ΔT. The other source 62 is connected to be controlled by the negative line 60 from discriminator 58 to provide a current for a time equal to the interval ΔT. The outputs of sources 62 and 64 are coupled to current summing node 66 into which source 64 pumps current or from which source 62 pumps current when of course ΔT ≠ 0.

Summing node 66 is connected to the input of integrator 68 which stores the charges provided at node 66 by the current sources and provides a voltage output $E_s$ proportional to the sum of the charges pumped in and out of node 66 and therefore proportional to ΔT. The output of integrator 68 is connected to terminal 34 of modulator 32 so that voltage $E_s$ can control the latter.

The entire operation of the system is such as to tend to reduce ΔT to zero. It should be remembered that when ΔT is zero, the peak of the summed signals $\phi_{AA}$ and $\phi_B$ is then equal the reference voltage $E_c$ . Now if $E_c$ is varied, that peak will then follow or track $E_c$ because each cycle will cause corrective pulses of appropriate sense and amplitude to be supplied to summing node 66.

The controlled peak amplitude can then be taken from the oscillator typically at the output of any of amplifiers 22, 24 and 26.

Because the duration of the pulses provided by sources 62 and 64 are proportional to ΔT the system will settle to an equilibrium wherein the duration of the pulses has decreased to zero. Since this means that at equilibrium no pulses will be generated, the output of integrator 68 assumes a steady state value. There is then no ac component at control input terminal 34, so no harmonic distortion component can thereby be introduced. Another beneficial effect of the reduction of pulse duration to zero equilibrium is that integration time is minimized which means faster settling time in response to changes in $f_o$ or the value of $E_c$.

The system of the invention can be at equilibrium for any value $E_c$ if the amplitude of oscillation of oscillator 20 is zero. Thus, the device preferably includes a zero amplitude sensor 70 which is connected to monitor the output of amplifier 24 and to provide a current pulse to summing junction 72 at the control input of current source 64 if the peak value of $\phi_A$ is zero, i.e. below some predetermined minimum.

Figure 4:
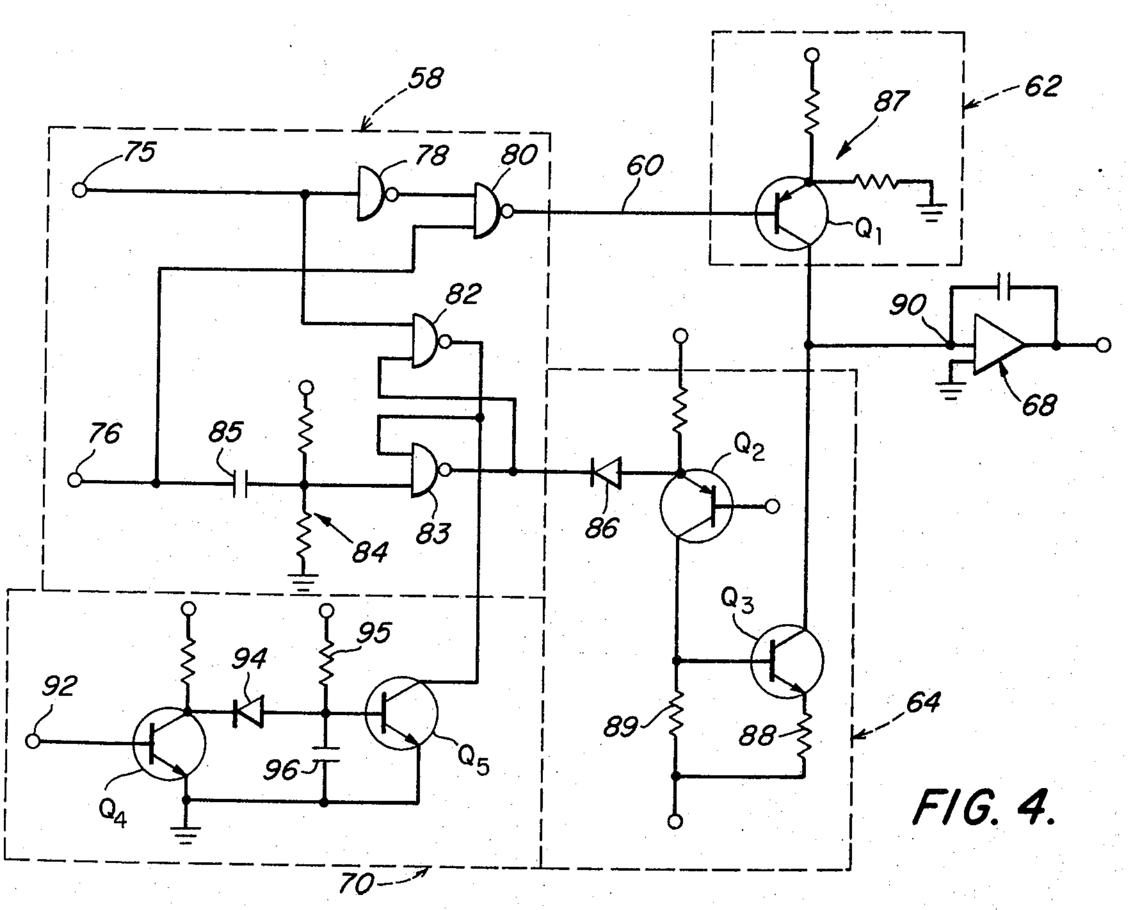
FIG. 4 is a circuit schematic showing exemplary details of part of the embodiment of FIG. 1.

As shown in FIG. 4, the device of FIG. 1 can readily be implemented. Time discriminator 58 is shown as including a pair of input terminals 75 and 76 respectively for connection to the outputs of comparators 52 and 56. Terminal 75 is connected to the input of inverter 78 and the output of the latter is connected to one of two inputs to NAND gate 80. Terminal 76 is connected to the other input of gate 80.

Discriminator 58 also includes a pair of NAND gates 82 and 83. The output of each of gates 82 and 83 is connected to a corresponding one of the input terminals of the other of gates 82 and 83. The other input terminal of gate 82 is connected to terminal 75, and the other input terminal of gate 83 is connected through capacitor 85 to input terminal 76. The other input of gate 83 is also connected to a tap on voltage divider 84 which is connected between groung and a terminal at which an appropriate potential can be applied.

Gate 80 is connected to current generator 62 which is shown in FIG. 4 as comprising pnp transistor Q1 having its base connected to the output of gate 80 and its emitter connected to a tap on voltage divider 87 which extends between a positive voltage source and ground.

Gate 83 is connected to current generator 64 which includes an input diode 86 having its cathode coupled to the output of gate 83 and its anode connected to the emitter of pnp transistor Q2. The usual means are provided for biasing the emitter and base of transistor Q2 at appropriate positive voltages to insure conduction. The collector of transistor Q2 is connected to the base of npn transistor Q3. The collector of the latter is connected to the collector of transistor Q1. The emitter of transistor Q3 is connected through resistor 88 to a source of an appropriate negative potential which is also connected through resistor 89 to the base of transistor Q3.

The collectors of transistors Q1 and Q3 are connected to the input summing point 90 of operational integrator 68.

In order to insure that $\phi_B$ has a finite peak value, the system includes zero amplitude sensor 70 which, in FIG. 4 simply comprises a pair of npn transistor Q4 and Q5. The base of transistor Q4 is connected to terminal 92 at which connection to the output of amplifier 24 is to be made. The emitter and collector of transistor Q4 are respectively grounded and connected to a positive current source. The collector of transistor Q4 is connected to the cathode of coupling diode 94. The anode of diode 94 is biased by connection to a positive voltage source through resistor 95, is connected through capacitor 96 to ground, and is also connected to the base of transistor Q5. The emitter of the latter is grounded and the collector of transistor Q5 is connected to the same input of gate 83 as the output of gate 82.

If ΔT is of one sense, for example logically positive, signal $E_{T2}$ at terminal 75 is inverted by inverter 78 and summed at gate 80 with signal $E_{T1}$ from terminal 76. Since gate 80 is selected for example so as to provide a positive output signal only. If the trailing edge of $E_{T1}$ occurs after the trailing edge of $E_{T2}$, then the summation provides a signal or pulse of some duration ΔT. When applied to the base of transistor Q1, it causes the latter to pump a current on the collector of transistor Q1 for the time ΔT into summing node 90.

Similarly if the trailing edge of $E_{T1}$ occurs prior to the trailing edge of $E_{T2}$, then the latter, as filtered by capacitor 85 and resistor 84 provides a signal which when summed in cross-connected gates 82 and 83 yields a pulse of some duration ΔT. The latter is applied through transistor Q2 to cause transistor Q3 to pump a current of its collector out of current node 90.

Integrator 68 of course simply integrates the total current pumped in or out of its summing junction 90 by the action of transistors Q1 and Q3.

The NAND gates in FIG. 4 typically provide an assertion or high output when either input is a negative or low signal, and provides a negative or low output when both inputs are assertion or high signals. Hence, it will be apparent that the output of gate 80 will be low during the period corresponding to ΔT as shown in FIG. 2F because during that period both $E_{T1}$ and $E_{T2}$ are high.

Voltage divider 87 and the potential applied thereto are selected such that transistor Q1 is cut off at some positive voltage such as +3 volts on its base and is on at for example, 0 volts. In the off state of transistor Q1, its emitter is then at typically +2.5 volts, so that when the base goes low due to a negative output from gate 80, about 2 volts will appear across the source resistance of the transistor causing a current, such as 4 ma, to flow into node 90.

If ΔT is logically negative, one input to gate 80 will be low and the gate output remains high, maintaining transistor Q1 in a cut-off state. However, it should be noted that gates 82 and 83 are connected to formed a bistable element or flip-flop. The trailing edge of the signal $E_{T2}$ at terminal 75 resets the flip-flop so that the output of gate 83 is low and the output of gate 82 is high. The tap on voltage divider 84 is at a voltage which biases the corresponding input of gate 83 at a logical high value so that the flip-flop remains in its reset state until the trailing edge of the signal $E_{T1}$ at terminal 76 occurs and signal $E_{T2}$ at terminal 75 is high. Then capacitor 85 and the resistors of voltage divider 84 differentiate the trailing edge of $E_{T1}$ and the output of gate 83 goes high. The output of gate 82 is forced low and the flip-flop is then in its set state. This set state remains during the interval Δ T as shown in FIG. 3F until a negative transition of $E_{T2}$ occurs, resetting the flip-flop.

Transistor Q2 does not conduct as long as gate 83 has a low (for example 0 volt) output, but during the interval ΔT, the output of gate 83 is high, typically at 3 volts. This permits transistor Q2 to conduct and the collector current flows through resistor 89 causing a current, for example 4 ma, to flow in the collector of transistor Q3 out of junction 90.

The zero amplitude sensor comprising transistors Q4 and Q5 operates by sensing the peak voltage of $\phi_A$. As long as the peak value of the voltage of $\phi_A$ seen at terminal 92 is large enough to cause transistor Q4 to conduct, capacitor 96 is clamped at a low voltage during a part of the cycle of $\phi_A$. The time constant of capacitor 96 and resistor 95 is such that insufficient charge is ordinarily accumulated in one cycle of $\phi_A$ (at some base value for frequency $f_o$) and consequently transistor Q5 will remain cut off. If however $\phi_A$ peak voltage is too low, diode 94 will not conduct during any portion of the cycle and a charge will build up on capacitor 96 large enough to place transistor Q5 into conduction. Conduction by transistor Q5 short circuits one of the inputs to gate 83 to its low state or ground. The output of gate 83 then goes high causing current flow out of node 90. This forces the output of integrator 68 to go more positive which, in the example shown, serves to increase the amplitude of the oscillation in oscillator 20.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. In combination with an oscillator having three cascaded amplifiers series connected in a closed-loop each for providing a phase shift so that the total loop phase shift is about 360° electrical degrees, and for generating at least a pair of substantially quadrature related sinusoidal signals in said loop; the improvement comprising;

means for providing a selected, substantially steady state reference signal;

means for comparing the peak value of the sum of said sinusoidal signals with the level of said reference signal and for providing a time signal having a duration proportional to the difference between said peak value and said level;

means for generating a control signal having an amplitude proportional to said duration;

means responsive to said control signal for generating a sinusoidal correction signal of the same or opposite phase as one of said pair of sinusoidal signals according to the sense of said control signal, and having a peak amplitude proportional to the amplitude of said control signal, and means for summing in said loop said connection signal with the other of said pair of sinudoidal signals.

2. The combination as defined in claim 1 wherein said time signal is positive or negative in a logical sense, according to any phase difference between said sum of said signals and one of said sinusoidal signals.

3. The combination as defined in claim 1 wherein said means for comparing and for providing said time signal comprises means for providing a first timing signal corresponding to the time that a the value of said sum equals said level during a transition of said sum in a first direction;

means for providing a second timing signal corresponding to the time when the value of a selected one of said sinusoidal signals equals the value of system ground during a transition of said one of said sinusoidal signals in said first direction;

the duration of said time signal being an interval between said first and second timing signals.

4. The combination as defined in claim 3 wherein said means for comparing and for providing said time signal includes means for assigning a logical sense to said time signal according as said first timing signal occurs before or after said second timing signal.

5. The combination as defined in claim 4 wherein said means for generating a control signal comprises a current integrator having a summing node at its inputs;

first and second current sources responsive respectively to opposite senses of said time signal for providing respectively oppositely directed currents at said node, said currents having substantially steady-state amplitudes and flowing for interval proportional to the duration of said time signal.

6. The combination as defined in claim 1 wherein said means responsive to said control signal is a modulator connected so that said one of said pair of sinusoidal signals constitutes one input to said modulator, and said control signal constitutes another input to said modulator.

7. The combination as defined in claim 1 wherein the first, second and third of said amplifiers provide, respectively in order phase shifts of $-\pi/2$, $-\pi/2$, and $-\pi$.

said pair of signals are respectively generated by said first and second amplifiers, and said means responsive to said control signal has an input connected to the output of said first amplifier and an output connected to the output of said second amplifier.

8. The combination as defined in claim 1 including means for detecting the amplitude of at least one of said sinusoidal signals and for providing an output signal when the peak value of the one of said sinusoidal signals is below a predetermined minimum value;

said means for generating a control signal being responsive to said output signal.

9. In combination with a sinusoidal phase-shift type of oscillator for generating at least two phase related output oscillatory signals, means for controlling the amplitude of said signals and comprising;

means for providing a summation signal proportional to the sum of said two oscillatory signals;

means for providing first and second steady-state reference signals;

a first comparator connected for generating a first timing signal when the peak value of said summation signal bears a predetermined relationship to the value of said first reference signal;

a second comparator connected for generating a second timing signal when the values of one of said oscillatory signals and said second reference signal bears a predetermined relationship to one another;

means for generating an oscillatory correction signal having a peak amplitude proportional to a time interval between said timing signals, and means for summing said correction signal with one of said output oscillatory signals.

* * * * *